United States Patent [19]
Spencer et al.

[11] Patent Number: 5,477,149
[45] Date of Patent: Dec. 19, 1995

[54] METHOD AND APPARATUS FOR NON-INVASIVE MONITORING OF SOLENOID VALVES

[76] Inventors: George M. Spencer, 809 Falcon La., West Chester, Pa. 19382; John W. McElroy, 51 Street Rd., Newtown Square, Pa. 19073; Michael H. Lind, 310 Missimer Dr., Royersford, Pa. 19469

[21] Appl. No.: 175,143

[22] Filed: Dec. 29, 1993

[51] Int. Cl.⁶ .................... G01R 31/327; G01B 13/03; E03B 7/07
[52] U.S. Cl. .................... 324/418; 364/551.01; 137/554
[58] Field of Search .................... 324/226, 178–180, 324/422, 415, 418, 423; 340/644, 540, 683, 686; 73/579; 376/204, 245, 258, 463; 137/551, 553, 554, 559; 364/551.01

[56] References Cited

U.S. PATENT DOCUMENTS

| | | |
|---|---|---|
| 3,859,619 | 1/1975 | Ishihara et al. . |
| 4,086,809 | 5/1978 | Wu et al. . |
| 4,809,742 | 3/1989 | Grau . |
| 5,000,040 | 3/1991 | Charbonneau et al. . |
| 5,008,841 | 4/1991 | McElroy . |
| 5,086,273 | 2/1992 | Leon .................... 137/554 X |
| 5,101,856 | 4/1992 | Kakinuma et al. .................... 137/554 |
| 5,144,977 | 9/1992 | Eggerton et al. .................... 137/554 |
| 5,153,522 | 10/1992 | Sano . |
| 5,154,080 | 10/1992 | Hill et al. .................... 137/554 |
| 5,193,568 | 3/1993 | Eissenberg et al. .................... 324/207.2 |
| 5,228,342 | 7/1993 | McShane .................... 73/572 |
| 5,236,011 | 8/1993 | Casada et al. .................... 324/207.2 X |

*Primary Examiner*—Sandra L. O'Shea
*Assistant Examiner*—Roger Phillips
*Attorney, Agent, or Firm*—Paul & Paul

[57] ABSTRACT

A non-invasive apparatus and method is disclosed which is adapted for testing of solenoid valves to verify valve operation. The non-invasive apparatus and method monitors with time both the stroke of the solenoid valve plunger to identify associated impacts and the state of the solenoid valve as being energized or de-energized to determine valve operability.

23 Claims, 7 Drawing Sheets

METHOD AND APPARATUS FOR NON-INVASIVE MONITORING OF SOLENOID VALVES

BACKGROUND OF THE INVENTION

1. Field of the Invention

This invention relates generally to diagnostic systems adapted for monitoring the operation of valves and valve operators and more particularly to non-invasive diagnostic methods and systems which are adapted for monitoring and verifying the operation of solenoid valves.

2. Description of the Prior Art

Solenoid valves or Solenoid operated valves (SOV's) generally define a class of valves which are operable through movement of an integral actuator in the form of a solenoid. This solenoid portion of the valve essentially is comprised of an electromagnet which is in the form of a coil and a movable plunger. In operation, the plunger is movable between an opened position and a corresponding closed position through application of an external voltage source upon the SOV, such as a suitable AC or DC voltage. In particular, as the voltage is applied to the SOV, a magnetic field is produced that attracts the solenoid plunger which causes a change in the state of the valve from its opened or closed position to the corresponding closed or opened position, respectively. When the voltage is thereafter removed, a spring or other force operates to return the plunger from its corresponding changed state to the original position within the SOV.

Solenoid operated valves have been widely utilized within much of industry and for many different applications. In most of these applications, the continual, proper operation of these valves is essential for maintaining effective plant operation. In particular, within the nuclear power industry, SOV's have been extensively used for providing both system operation as well as for safety related reasons. Specifically, for this type of application, proper SOV operation is especially critical in order to prevent possible release of harmful radioactive materials either directly or indirectly.

In recent years, because of numerous reported malfunctions occurring within the nuclear power industry, the INPO (Institute of Nuclear Power Operations) and the NRC (Nuclear Regulatory Commission) have instituted several rigid guidelines on that industry for verifying proper operation of solenoid valves. Particularly, nuclear power plants are now required by ASME Section XI to perform evaluation by stroke timing quarterly on all critical SOV's. Generally, the purpose for this code requirement is to detect SOV degradation through evaluation of valve position. Specifically, an SOV will take a particular amount of time to stroke or, in other words, in order to travel between its opened and closed positions, or vice-versa. In this regard, as a valve undergoes degradation through use, the stroke time of the SOV will increase. As such, the ASME code sets forth the requirement that if stroke time of an SOV should increase by 50% or more from the previous quarterly test, then the test frequency thereafter is increased to once a month until corrective action is taken.

Current inspection techniques that have been adapted for evaluating the operation of a nuclear plant's solenoid valves have proven inadequate; especially in view of ASME Section XI. In particular, in the past SOV operation had been typically verified by performing leak rate testing on the respective solenoid valves. Generally, leak rate testing procedures involve monitoring the amount of leakage from both the internal portion of the SOV to the atmosphere and also between the internal sealed parts of the device. However, contrary to the ASME requirements, leak rate testing does not provide timing of SOV operation since the valve is functionally inoperable during such testing procedures. In addition, other problems are that such procedures are rather time consuming in both setting up and testing, thus subjecting test personnel to extended periods of time within radiation areas.

Presently, there are a number of other various inspection techniques which have been utilized for verifying operation of other types of valves aside from solenoid valves. However, such diagnostic techniques are deficient for solenoid valve application. For example, some techniques involve opening or disassembly of the valve for visual inspection of the internal components. Such intrusive techniques however require additional testing following reassembly of the valve in order to verify valve operation. In addition, such techniques also do not incorporate the required stroke timing operation on the valve in accordance with the ASME code.

Other current diagnostic techniques incorporate acoustic or magnetic evaluation of the valve or, in some instances, a combination of both acoustic and magnetic evaluation techniques. Generally, acoustic techniques involve the detection of acoustic energy or vibrations produced by the internal components of the valve. For such applications, an acoustic sensor is employed in order to detect the acoustic vibrations produced by the valve. With magnetic techniques, generally the magnetic field of an installed magnet within the valve is monitored as the position of the magnet on the internal components change during operation. With this operation, a magnetic field sensor is utilized which operates to detect variations in the magnetic field strength of the moving magnet. After which, in order to determine valve operation, the data associated with either the acoustic vibrations or magnetic field strength of the particular valve is thereafter analyzed individually or in combination in order to monitor the internal valve condition.

Several problems however are known to exist with the aforementioned prior art devices. In particular, such diagnostic techniques require rather invasive procedures to accommodate valve testing. Specifically, the valve is required to be manually disassembled or otherwise modified in order to accommodate the additional equipment or components (magnets) which are necessary to accomplish the testing operation. However, as indicated earlier, such intrusive techniques require additional testing following reassembly of the valve in order to verify valve operation. In addition, when the valve is located within a radiation area, this poses an additional problem since the test personnel would be subjected to an increased radiation exposure. Furthermore, it is oftentimes a problem to interpret the data associated with such prior art devices. For example, in many instances, it is difficult to evaluate the particular time period in which the valve undergoes a change in state from either its closed or opened positions. Additionally, such techniques oftentimes do not afford consistent results from one testing operation to the succeeding test, thus not providing an accurate indication of valve operation. In particular, with SOV application, such inconsistent results could be compounded by application of the ASME code. Specifically, under code requirements, the stroke time data obtained for a particular valve can be rounded off to the nearest full second. As such, a small variation from one test to the next resulting from such inconsistent operation could potentially exceed the 50% criteria under the code, which thereafter would require an increased frequency of testing until corrective action would be taken. For example, most nuclear power plants employ small power operated valves which are capable of stroking in two seconds or less. As a consequence, a valve potentially could test at a stroke time of 1.49 seconds during one test and 1.51 seconds during the subsequent test, as a result of inconsistent testing operation. Therefore, under the code these time periods, when rounded to 1.0 and 2.0 seconds, respectively, would exceed this 50% criteria allowed by the code. In reality, however, such difference of only 0.02 seconds in stroke time is usually not an indicator of significant valve degradation requiring the increased testing procedures. However, in other circumstances, a fairly appreciable amount of valve degradation potentially could go undetected due to the inconsistencies in testing operation, which, in some instances, would result in very severe implications. In particular, as a result of testing inconsistency, the difference in stroke time detected from one test to the subsequent test potentially could be less than the actual difference in stroke time of the valve. Consequently, in these instances, valves that have undergone degradation to a point of not being sufficiently operable would continue to be used either without being changed or monitored with the increased frequency of testing.

Furthermore, many techniques also employ separate components which provide a rather cumbersome procedure for operation when in conjunction with the valve. Still these and other techniques also require additional equipment aside from that used in conjunction with the valve in order to analyze the data obtained. As such, this further delays the time required by which determination of valve operation can be made.

Because of these and other problems associated with valve inspection techniques presently employed, there now exists a strong need for an inspection technique specifically adapted for verifying operation of solenoid valves; especially those utilized within nuclear power plants.

SUMMARY OF THE INVENTION

The present invention provides a valve inspection technique specifically adapted for use in verifying operation of solenoid valves; in particular, for application with solenoid valves utilized within nuclear power plants. In accordance with the present invention, a noninvasive apparatus and method which is adapted for inspecting a valve of the solenoid type is provided. A solenoid type valve includes an electrical coil and a movable plunger disposed therein. In operation, the solenoid type valve is operable between a de-energized state and an energized state in response to an application of a suitable voltage source. The plunger movement is between an open position and a closed position corresponding to changes in state of the solenoid valve. The electrical coil is adapted to generate an electric field when the solenoid valve is in its energized state. For this purpose recited above, the present invention provides a non-invasive monitoring apparatus comprising an electric field sensor means, acoustic sensor means and processing means. The electric field sensor means is adapted to detect an electric field generated by the electrical coil for identifying the energized or de-energized states of the solenoid valve. The electric field sensor means is also adapted for generating data corresponding with the state of the solenoid valve for analysis. The acoustic sensor means is adapted for detecting acoustic vibration produced by the solenoid valve as the plunger moves between its open and closed position corresponding to changes in state of the solenoid valve. In particular, the acoustic sensor means detects acoustic vibration which results from impacts associated with the plunger as movement thereof is into its open or closed positions. The acoustic sensor means is also adapted for generating data corresponding to the detected acoustic vibration for analysis. The processing means is adapted for processing the data that is generated by both the electric field sensor means and acoustic sensor means with time for determining the operable condition of the solenoid valve.

The present invention also provides a non-invasive method which includes the step of both monitoring the electrical coil for detecting the electric field generated over a test cycle for identifying the state of the solenoid valve and for generating data corresponding with the identified state of the solenoid valve for analysis. The method further comprises the step of both detecting acoustic vibration produced by the solenoid valve over the test cycle which is indicative of the movement of the plunger between its open and closed positions and for generating data corresponding to the detected acoustic vibration for analysis. The method also includes the step of processing the generated data corresponding to both the detected state of the solenoid valve and the detected acoustic vibration for determining the operable condition of the solenoid valve.

In accordance with the present invention, an object is to provide an inspection technique specifically adapted for use with solenoid valves.

It is another object of the present invention to provide a solenoid valve inspection technique which is completely non-invasive in relation to the valve itself.

It is still another object of the present invention to provide an inspection technique which is adapted for solenoid valves used in nuclear power plant operation.

It is still another object of the present invention to provide a valve inspection technique which is portable, accurate and which provides for easily understandable data to its user.

These and other objects of the present invention will become more readily apparent when taken into consideration with the following description and the attached drawings.

DETAILED DESCRIPTION OF THE PREFERRED EMBODIMENTS

Figure 1:
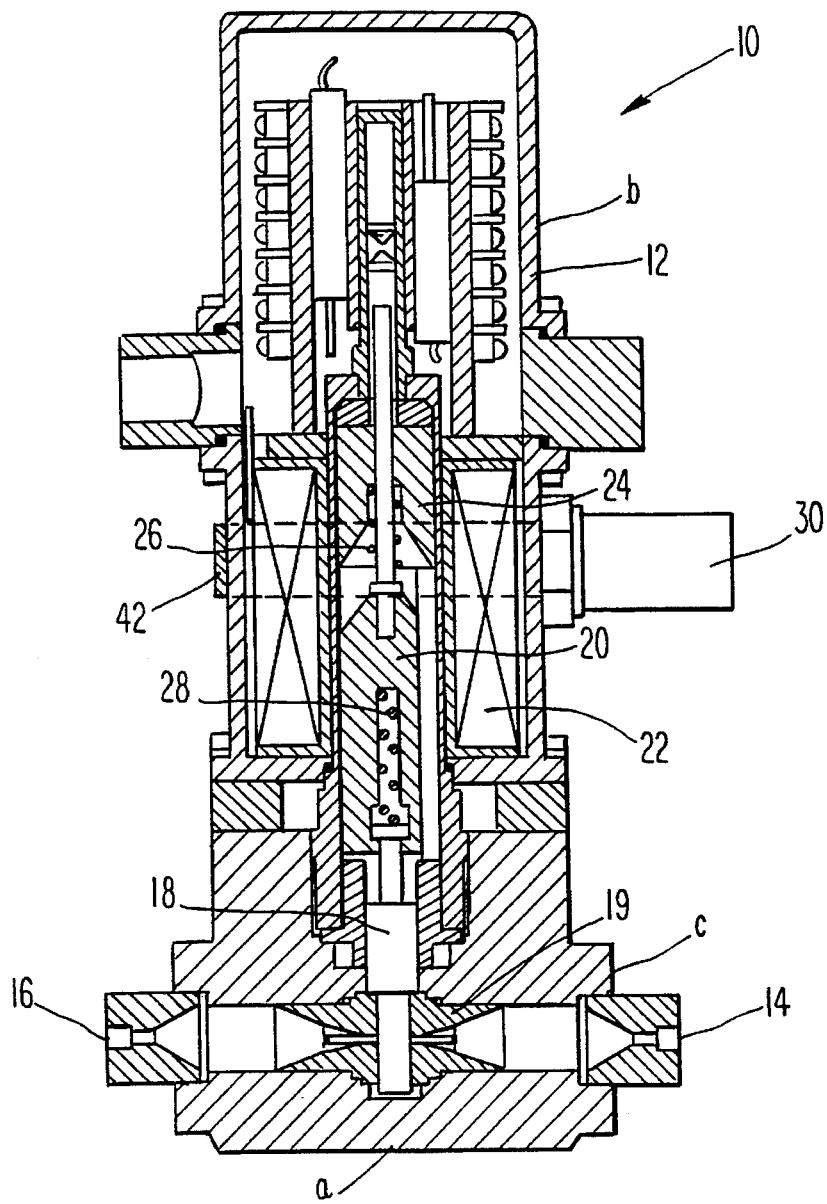
FIG. 1 is a sectional, elevational view of a solenoid valve showing a dual sensor according to the present invention mounted thereto.

Referring now to the drawings in detail, wherein like reference numerals indicate like elements throughout the several views, there is shown in FIG. 1, a sectional, elevational view of a valve 10 of the solenoid type. The solenoid valve 10, as illustrated, is of the gate-type construction and is provided for purposes of illustration only, as will be described in detail below in relation to the apparatus and method according to the present invention. It is to be understood, therefore, that the present invention shall have application with all types of solenoid valves or valves which are operated through use of a solenoid.

The solenoid valve 10, as shown, includes a housing 12 provided with an inlet port 14 and an outlet port 16 which provides a path for fluid flowing through the valve 10. A movable disc 18 is also provided which is adapted to regulate the flow of fluid passing through the housing 12 from the inlet port 14 to the outlet port 16. The disc 18 is mounted to a plunger 20 which regulates the position of disc 18 for regulating the fluid flow. In particular, the plunger 20 is movable axially in the housing 12 between a fully open position and a fully closed position. When the plunger 20 is in its fully closed position, the disc 18 is positioned in contact with a valve seat 19 so as to completely block the flow of fluid from passing through the vane 10, as illustrated in FIG. 1. The plunger 20, when it is in its fully open position, raises the disc 18 so as to allow the fluid to flow uninhibited through the housing 12.

Generally, the movement of the plunger 20 is controlled by a coil 22. The coil 22 is provided surrounding the plunger 20 in the housing 12. The coil 22 is generally a simple wire coil that is responsive to application of a voltage source on the valve 10. The coil 22 when it is energized by the voltage applied to the valve 10 creates a magnetic field which attracts the plunger 20 to the fully open position in contact with a stop 24. The magnetic force which attracts the plunger to the stop is represented by the general equation $$Fm = (NI)^2 / A(Ro + x/A)^2$$

where N equals the number of wired turns, I=the coil current, A=the cross-section area of the plunger, and x=the length of air gap if present in the core. In the foregoing equation, Ro is the reluctance of the non-air gap portion of the coil.

As to the voltage applied to the valve 10 for energizing the coil 22, this can comprise either a direct current (DC) or an alternating current (AC).

With a DC current, the magnetic field which is produced by the coil 22 is constant in form. However, with an AC current, the magnitude and direction of the magnetic field generated by the coil 22 will vary with the variation in the AC current. When the voltage ceases being applied to the valve 10, the coil 22 becomes de-energized removing the magnetic field which allows the plunger 20 to shift to its original closed position by the force of a return spring 26. A second disc spring 28 can also be provided which further urges the disc 18 into the closed position in contact with the valve seat 19.

When a solenoid valve is operating properly, the plunger 20 will be moved at a specified rate between its open and closed positions corresponding to the energized and de-energized states of the coil 22. Generally, as a solenoid valve undergoes degradation through use and over time, the performance of the plunger 20 will evidence changes in operation, such as fluctuations in the rate of movement between the open and closed positions or not be able to attain the fully open or closed positions, as examples. Further, the degradation in valve performance will affect several other conditions, such as valve leakage or flow regulation outside the parameters specified by the valve.

As indicated earlier, defective or otherwise hindered valve operation can have very severe implications; especially depending on the application of the solenoid valve. With respect to the nuclear power industry, proper solenoid valve operation is critical to prevent potential radioactive contamination or exposure. As a result of such recent concerns in the nuclear industry, several guidelines have been imposed for the operation of solenoid valves utilized within nuclear plants. Specifically, the valve disc movement between the closed position and the open position corresponding with movement or "stroke" of the plunger is required to occur within a specified time. Currently, the guidelines require that the industry test the stroke time of all solenoid vanes four times each year. However, should the stroke time of a valve increase by 50% or more from the previous quarterly test, the guidelines require that the test frequency be increased to once a month until corrective action is taken, such as repair or valve replacement. Generally, the stroke time of a valve can undergo a certain amount of degradation or otherwise fluctuation without affecting the operation of the valve.

As indicated earlier, presently there is no available technique specifically adapted for analyzing the stroke time of solenoid valves. Further, current diagnostic techniques utilized with other types of valves are deficient for solenoid valve application. In particular, the analysis of the operation of a solenoid valve requires an evaluation of certain specified parameters. Specifically, valve operation is a result of the movement of the valve disc in association with the operation of both the plunger and the coil in response to the application of external voltage sources. The other diagnostic techniques are also deficient for several other reasons. For example, other techniques require disassembly or otherwise modification of the valve in order to allow installation of a device so as to allow monitoring of the valve, such as a magnet or other device. This is a disadvantage for two reasons. In particular, after the valve is reassembled, valve operation again needs to be verified. In addition, in order for modifying the existing valve, the technician could be required to spend an extended period within a radiation area depending on the valves location. Other techniques also employ a number of separate units which do not provide immediate test results in respect to the valves condition. Further, other techniques also do not provide accurate enough test results; especially in relation to the faster acting solenoid valves utilized in nuclear power plants. These foregoing examples are just a few of the deficiencies prevalent with other diagnostic techniques.

Figure 2:
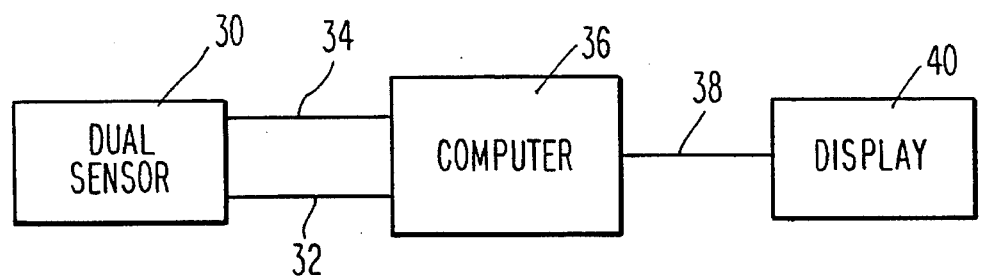
FIG. 2 is a block diagram of the non-invasive apparatus and method according to the present invention.

The present invention provides a completely non-invasive apparatus and method which is adapted for verifying the operability of solenoid valves. In FIG. 2 is illustrated a block diagram of the non-invasive apparatus and method according to the present invention. As illustrated, the apparatus comprises a dual sensor connected via lines 32 and 34 to a processing means or computer 36, which will be described in detail below. the processing means 36 in turn is connected via a line 38 to a display 40. In operation, the dual sensor 30 is placed in contact with an exterior surface of the valve 10, as illustrated in FIG. 1. Preferably, the dual sensor 30 is mounted to the valve 10 in order to eliminate the need for test personnel to hold the dual sensor 30 in contact with the valve 10. As illustrated in FIG. 1, the dual sensor 30 is shown mounted to the valve 10 by means of a snap lock clamp 42, however any other suitable means can also be utilized for this purpose. In this embodiment, the dual sensor 30 is mounted to the valve 10 proximate the coil 22, however it should be understood that the dual sensor 30 can be maintained at other locations for this same purpose. For example, the dual sensor 30 preferably can be maintained at any of the other indicated locations referenced by the letters a-c in FIG. 1.

In this embodiment, the dual sensor 30 is enclosed as a single unit comprised of both an electric field sensor means or gauss probe, and an acoustic sensor means or accelerometer. It should be understood, however, that the accelerometer and gauss probe can be provided as individual components as well, and positioned in contact with the valve spaced from one another. The gauss probe portion is adapted to detect the presence of electric field (EMF) when the coil is in its energized state. However, while a gauss probe is disclosed in this embodiment, it should be understood that any suitable device adapted for detection of EMF can be used for this purpose. The gauss probe also generates data in the form of analog voltage signals corresponding to whether or not the coil is in its energized or de-energized states. As indicated earlier, the specific pattern of the analog signals is dependent on the type of voltage source applied to the solenoid valve 10, such as an AC or a DC source.

The accelerometer, for example, can comprise a piezoelectric crystal or other suitable device adapted to detect acoustic vibration in the valve associated with movement of the plunger 20. Specifically, as indicated earlier, the plunger 20 impacts the stop 24 in its open position and forces the valve disc 18 to impact the valve seat 19 when the plunger is in the closed position. The accelerometer also generates data associated with the detected acoustic impacts in the form of analog voltage signals for analysis.

In accordance with the present invention, the accelerometer and gauss probe are adapted to monitor the solenoid valve 10 over a predetermined timed interval which defines a test cycle in order for identifying the operable condition of the valve 10. In accordance with the preferred embodiment, for this purpose, the data generated from both the gauss probe and accelerometer are passed via the lines 32 and 34, respectively, to the processing means 36 for analysis, as will be described in detail below.

Figure 3:
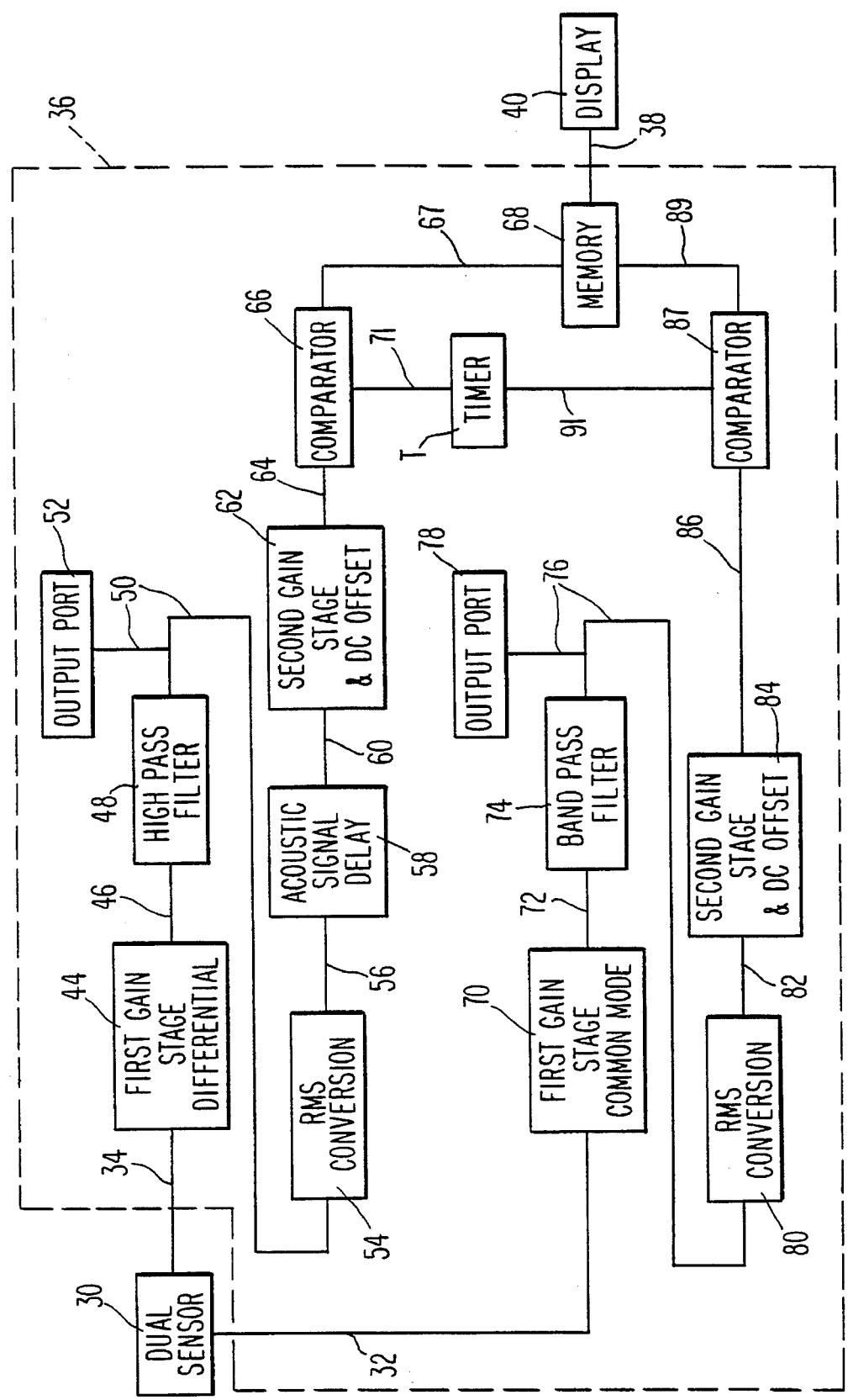
FIG. 3 is a block diagram illustrating the portions of the processor utilized for conditioning the signals received from the dual sensor.

The data signals generated from the gauss probe and accelerometer are first conditioned by the processing means 36. FIG. 3 illustrates a block diagram of the portion of the processing means 36 utilized to condition the signals from the gauss probe and accelerometer, respectively, however, it should be understood that other arrangements can also be utilized for the same purpose. As illustrated in FIG. 3, the data generated from the accelerometer is input via the line 34 to a first gain stage differential 44 adapted for amplifying the signals a predetermined amount, preferably a gain of 400. The signals are then passed from the first gain stage differential 44 via a line 46 to a high pass filter 48, which preferably filters out frequencies below 1 kilohertz. The high pass filter 48 is connected via a line 50 to both an output port 52 and an RMS convertor 54. In situations where desired, the signals from the high pass filter 48 can be monitored via the output port 52, such as by outputting to a recording or other device. The RMS convertor 54 is adapted to demodulate the signals passed from the high pass filter 48. The demodulated signals are then passed via the line 56 to a signal delay 58. The signal delay 58 is adapted to delay the acoustic signals a specified amount so as to ensure proper analysis in comparison with the associated electric field data. In this regard, the acoustic signals preferably are delayed approximately 15 milliseconds, which later is subtracted to compensate for the delay. The signals from the delay 58 are then passed via a line 60 to a second gain stage and DC offset 62. The second gain stage and DC offset 62 is adapted to amplify the signals, preferably by 10, and then reset the position of the signals down to zero. The second gain stage and DC offset 62 passes the conditioned acoustic signals via a line 64 to a comparator 66, which, in turn, is connected via a line 67 to a memory 68 for storing associated dam.

Similar to that described above, the data generated from the gauss probe is input via the line 32 to a first stage gain common mode 70, which operates to both amplify the signals a predetermined amount and thereafter pass only signals of specified voltages. Preferably, the first gain stage common mode 70 operates to amplify the signals by 10 and thereafter pass signals less than or equal to 700 millivolts. For signals greater than 700 millivolts, the signals which are passed are limited in voltage to 700 millivolts. The first gain stage common mode 70 is connected via a line 72 to a band pass filter 74. The band pass filter 74 operates to pass a predetermined range of frequencies, preferably between 50 and 150 hertz. Similar to that described above in relation to the acoustic signal, the band pass filter 74 is connected via a line 76 to both an output port 78 and an RMS convertor 80. The RMS converter 80, in turn, is connected to a second gain stage and DC offset 84 via line 82 for a similar purpose. The conditioned electric field signals are thereafter passed from the second gain stage and DC offset 84 via a line 86 to a comparator 87. The comparator 87 in turn is connected to the memory 68 by a line 89.

In accordance with the present invention, the processing means 36 is adapted to process the acoustic and electric field data with time to determine the operable condition of the solenoid valve 10. A counter means or Timer T is provided for this purpose associated with the processing means 36 for providing a series of timing pulses for use in analysis of the input data. As illustrated in FIG. 3, the timer T in this embodiment is in connection with the comparators 66 and 87 by lines 71 and 91, respectively. The processing means 36, via the comparators 66 and 87, is programmed so as to determine both the acoustic impacts associated with the plunger and the electric field associated with the coil over a predetermined timed interval in the manner described below.

Figure 4A:
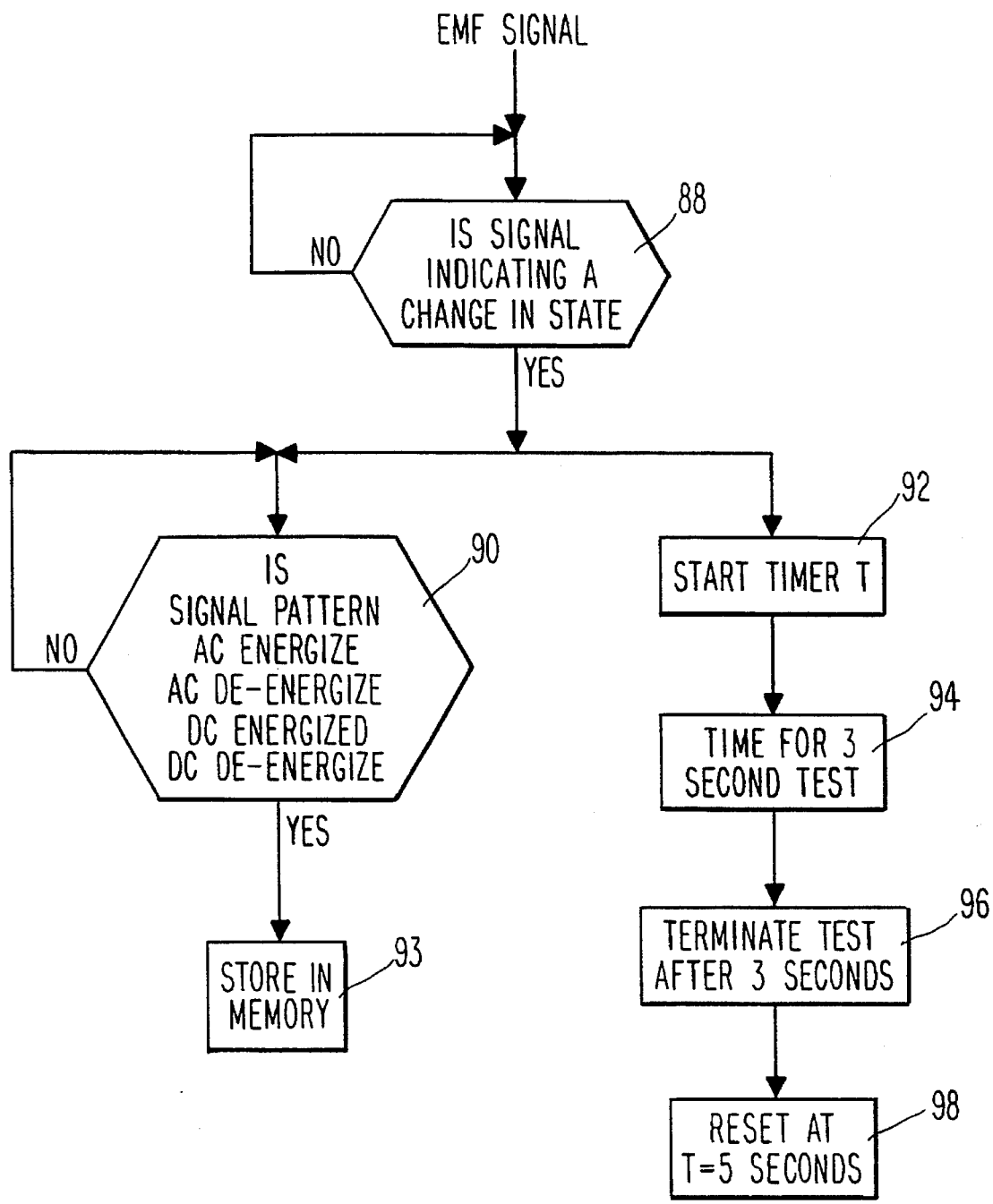
FIG. 4a is a flow diagram illustrating the programming of the processor as it is operated in relation to an EMF signal.

FIGS. 4a and b illustrate flow diagrams of the programming of the processing means 36 as it is utilized to analyze the data collected in relation to the solenoid valve 10. In FIG. 4a, the EMF signal in relation to the electric field data is input at point 88. At point 88, a determination is made as to whether or not there is a change in state of the solenoid valve 10. If the answer to this question is "yes", then the program proceeds to the points 90 and 92. Otherwise, the program remains at the point 88. At the point 90 in the program, a determination is made as to the type of voltage signal applied to the solenoid valve 10, and the state to which the solenoid valve has changed (either energized or de-energized state). The data in relation to point 90 is stored in memory at point 93.

At point 92 in the program, the timer T is started coinciding with the detection of the change in state at point 88. The program proceeds to point 94 which simultaneously initiates the predetermined timed interval in which the data in relation to the EMF and acoustic signals are analyzed. In the present embodiment, the timed interval has been designated at 3 seconds, and at the point 96 in the program, the 3 second cycle is terminated. The program thereafter proceeds to point 98 in which a reset command is generated after a predetermined interval to reset the timer T and memory 68, preferably an additional 2 seconds following termination of the 3 second cycle.

Figure 4B:
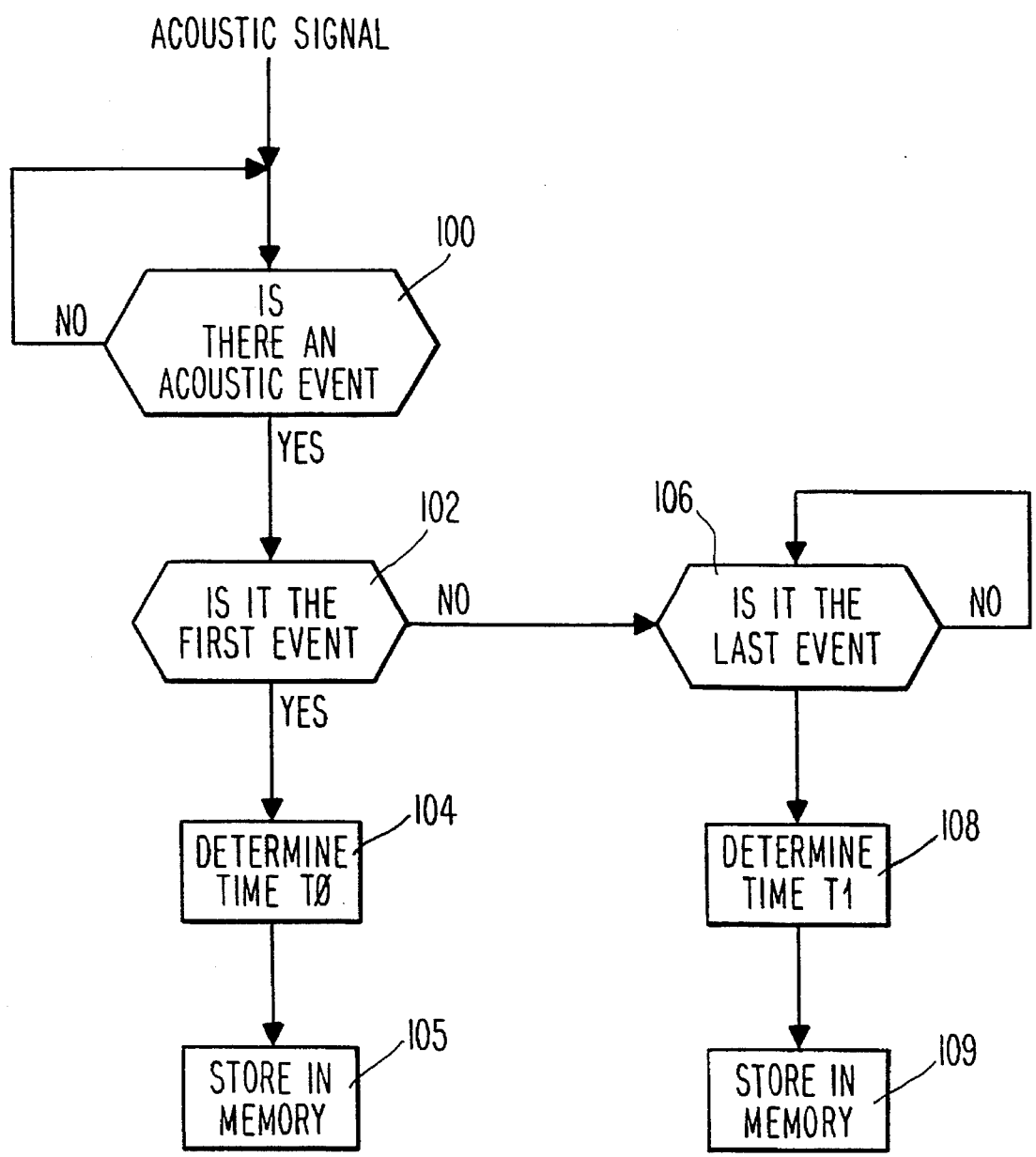
FIG. 4b is a flow diagram illustrating the programming of the processor as it is operated in relation to an acoustic signal.
Figure 5:
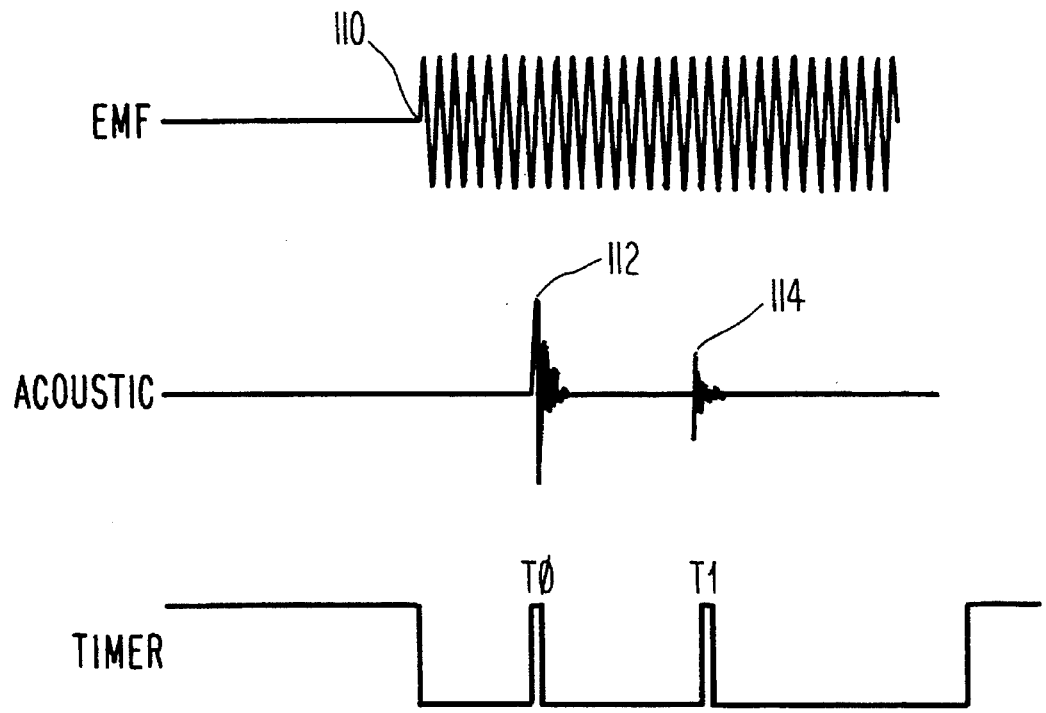
FIGS. 5–10 are graphic representations for explanation of the apparatus and method according with the present invention.
Figure 6:
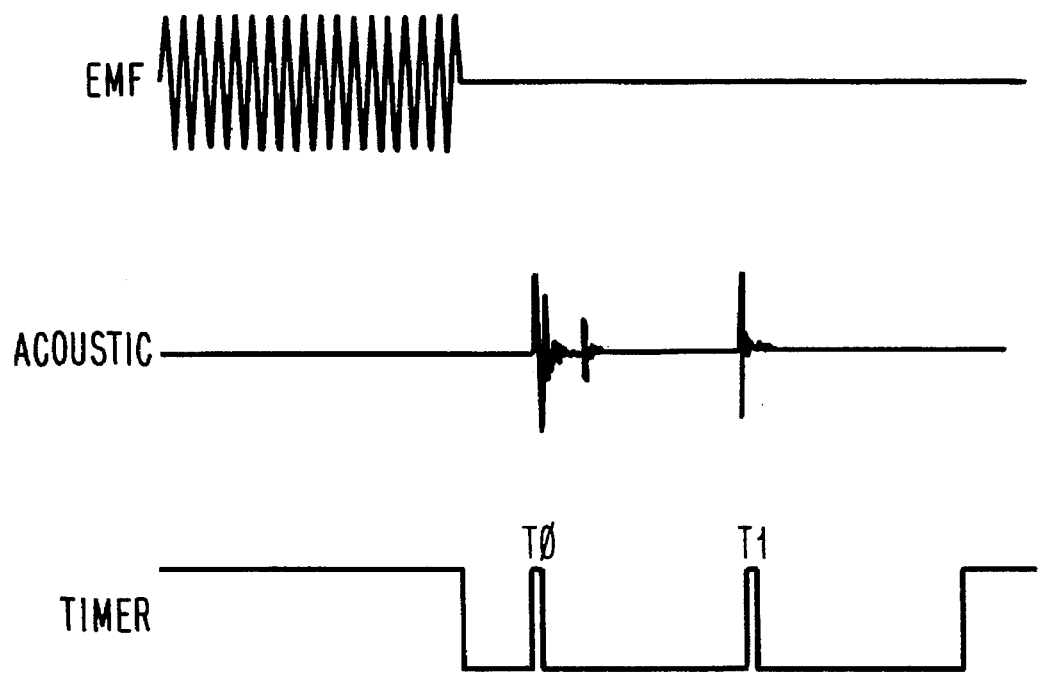
Figure 7:
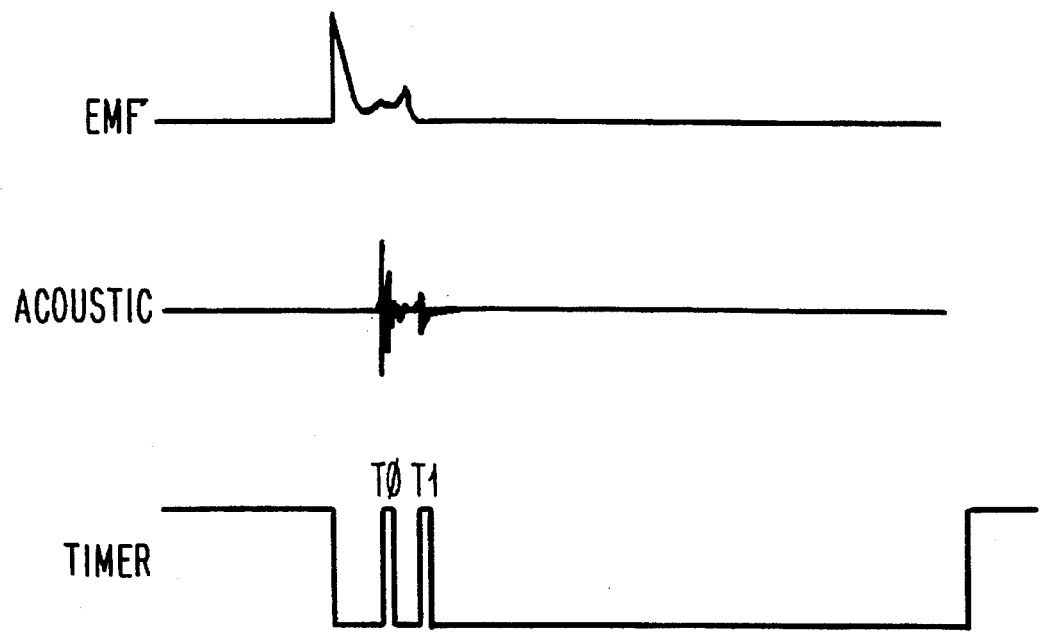
Figure 8:
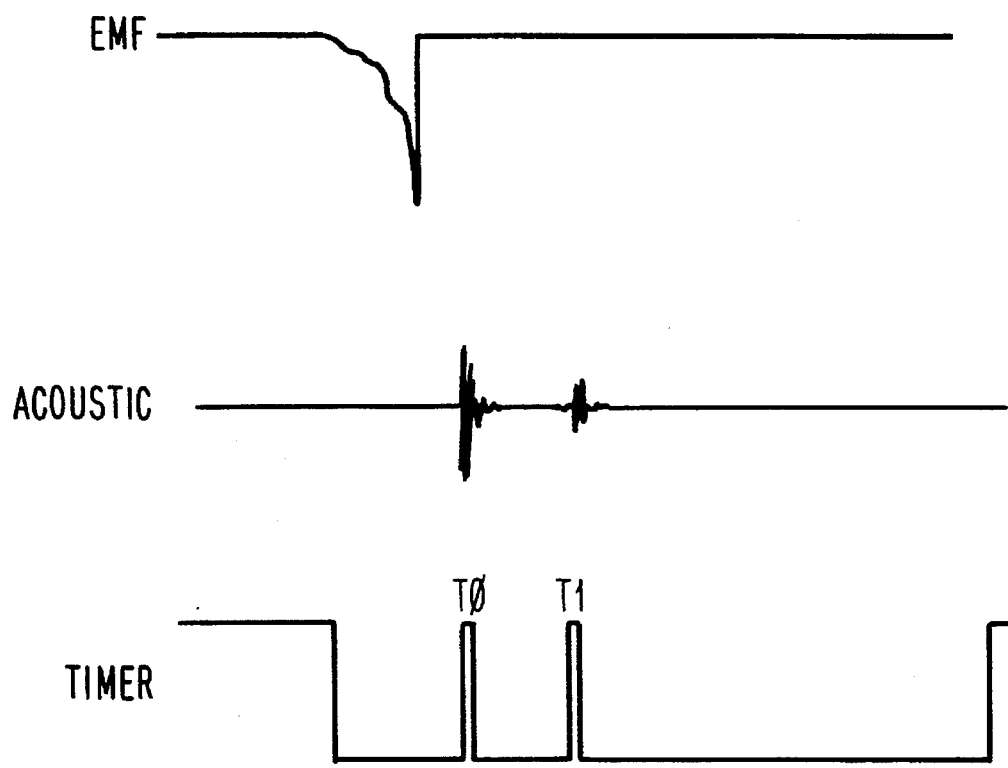

Similar to the EMF signal at point 88, as illustrated in FIG. 4b, the acoustic signal is input at point 100 in the program. At point 100, determination is made whether or not an acoustic event has been detected. If the answer to this question is "yes", then the program proceeds to point 102, otherwise, the program is retained at point 100. At point 102, determination is made as to whether or not the acoustic event is the first event that has occurred subsequent to the initiation of the 3 second timed interval. If the answer to this question is "yes", the program then proceeds to point 104, which indicates the time at which the first event was detected. The program then proceeds to store the data corresponding to point 104 into computer memory at point 105. However, if the determination at point 102 is made that the event is not the first event this has occurred, the program than proceeds to point 106. At point 106, determination is made whether or not the event is the last event occurring over the 3 second timed interval. If the answer to this question is "yes", then the program proceeds to point 108 which determines the time corresponding to the point 106. Similarly, the data associated with point 108 is stored in computer memory at point 109. Otherwise, if at point 106 it is determined that the event is not the last event that has occurred over the 3 second timed interval, the program will remain at this position.

FIGS. 5–8 are graphic representations which illustrate the tracings associated with the electric field and acoustic signals and timer as might occur in relation to the flow diagram as recited above. In FIGS. 5–8, the four possible state change combinations are each identified, such as that corresponding with the AC energize change of state, AC de-energize change of state, DC energize change of state and DC de-energize change of state, respectively. As illustrated in the Figures, the 3 second interval or window in which the data is analyzed is initiated upon the detection of a change in state of the valve, such as that indicated in FIG. 5 at 110 corresponding with the electric field trace. After which time, the impacts associated with the plunger movement are shown in the acoustic traces and the times corresponding therewith are identified. For example, as shown on the acoustic trace in FIG. 5 at 112 and 114, the impacts are illustrated associated with the plunger 20 when in the open position and of the vane seat 19 when the plunger 20 is in the closed position.

In the present embodiment, as indicated earlier, the dam output is comprised of both the times associated with the first and the last acoustic impacts and the corresponding change in state of the valve 10. In this regard, the data output is passed to the display 40 where it can be read by the test personnel. Preferably, for ease of understanding, the data which is displayed is in the form of seconds in relation to the acoustic impacts and indicates either energized or de-energized in relation to the state of change of the valve 10. However, if desired, other data or data in other formats can also be output, such as the graphic data or any portion thereof shown in FIGS. 5–8.

Furthermore, preferably the present invention is programmed in order to display the data output results in groups of two test cycles, corresponding to two subsequent state changes of the valve 10. In this regard, a complete evaluation of the vane 10 in both the energized and de-energized states and associated plunger data is obtained. Thus, in this regard, the data associated with the movement of the plunger from both the closed to the open positions and from the open to the closed positions is analyzed at one time as to determine proper operation of the entire valve.

The present invention is also adapted to detect errors in the monitoring procedure or failure in the solenoid valve 10 as preventative measures. In this regard, the processing means 36 is adapted to detect both more than one change in state over the 3 second timed interval or acoustic impacts occurring passed the termination of the 3 second timed interval, which in the present embodiment is prior to 5 seconds. In the present embodiment, the processing means 36 is programmed to abort a test cycle in response to such detected event and thereafter repeat another testing cycle. However, in other instances, the processing means 36 can also be adapted to be in communication with the solenoid valve 10 or an associated valve operator in order to terminate system operation.

Figure 9:
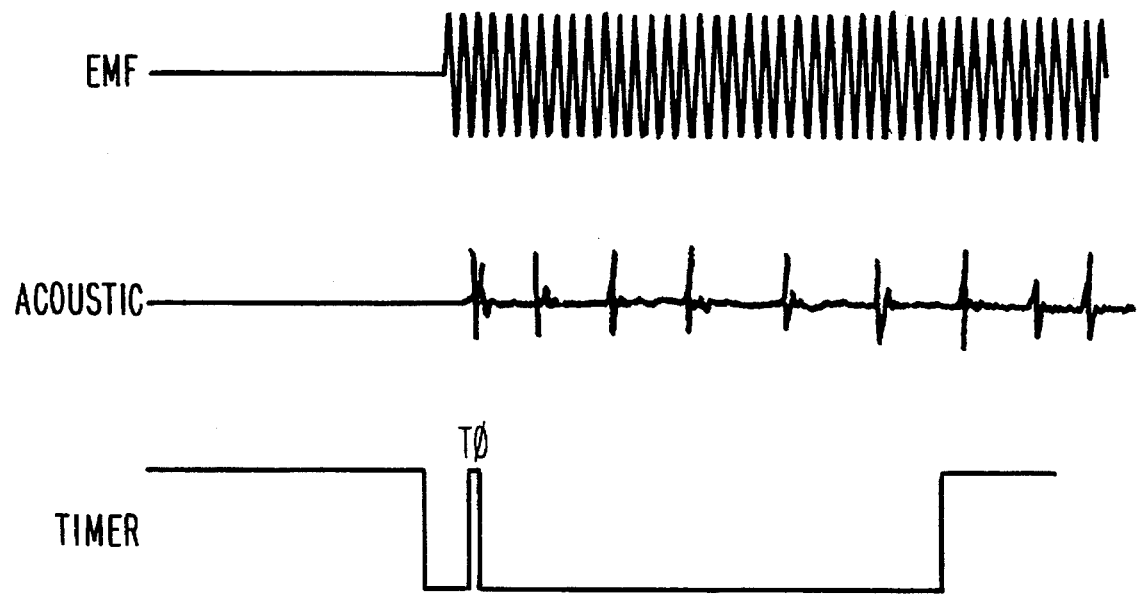
Figure 10:
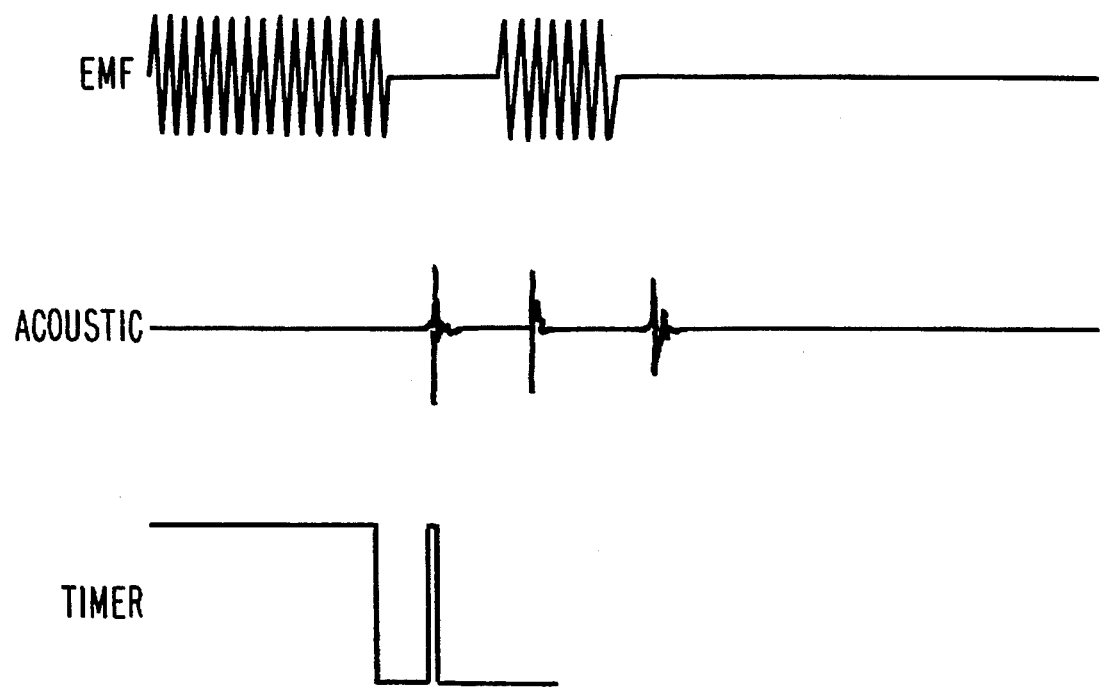

FIGS. 9–10 are graphic representations which illustrate examples of the electric field, acoustic and timing traces in relation to AC energize and AC de-energize changes of state, respectively, associated with the abort conditions indicate above.

Based on the foregoing description, it will be understood that the present non-invasive apparatus and method for monitoring of solenoid valves is adapted to detect valve operability based on an analysis of both plunger and coil operation over a particular time period. In particular, acoustic impacts associated with the stroke of the plunger are monitored as the valve undergoes a change in state. Furthermore, monitoring of the electric field generated by the coil determines the state of the valve and when a change in state has occurred. Accordingly, the non-invasive apparatus and method of the present invention can be adapted to address the guidelines imposed by ASME section XI on the nuclear industry. Particularly, the present invention is specifically adapted to monitor the stroke time of a solenoid valve, thus in accordance with ASME requirements. Additionally, the present invention is adapted to operate at a high degree of accuracy, preferably ±8 milliseconds, which is well suited for use with the small, quick stroking valves which are usually utilized in nuclear plants.

In view of the foregoing, it will be understood that an advantage of the present invention is to provide a monitoring apparatus specifically adapted for use with solenoid valves; in particular, solenoid valves utilized for nuclear power purposes. In this regard, it is another advantage that the present invention is completely non-invasive in that the only requirement is to mount the sensor in contact with the outside of the solenoid valve. This operates to reduce the time test personnel would need to spend in radiation areas. Furthermore, still another advantage is that the present invention is adapted to provide immediate indication of valve operation, which both further reduces time spent by test personnel in radiation areas and also serves to quickly identify any malfunctioning valve so that immediate action can be initiated. It is another advantage of the present invention in that it is adapted to be utilized with both. AC and DC current operated valves and also provides accurate test results, thus allowing for use of the device over wider ranges and with all types of solenoid valves.

It will be recognized by those skilled in the art that changes may be made by the above-described embodiments of the invention without departing from the broad inventive concepts thereof. For example, while the present invention has been described as being adapted for solenoid vanes, it is understood that the present non-invasive apparatus and method can have application with other types of valves and devices where appropriate. It is understood, therefore, that this invention is not limited to the particular embodiments disclosed, but it is intended to cover all modifications which are within the scope and spirit of the invention as deemed by the appended claims.

We claim:

1. A non-invasive apparatus adapted for monitoring a valve of the solenoid type having an electrical coil and a movable plunger disposed therein, the solenoid valve being operable between a de-energized state and an energized state in response to application of a suitable voltage source thereto, with the plunger movement being between an open position and a closed position corresponding to changes in the state of the solenoid valve and the electrical coil being adapted to generate an electric field when the solenoid valve is in its energized state, the non-invasive monitoring apparatus comprising:

electric field sensor means adapted for non-invasively detecting the electric field generated by the electrical coil for identifying the energized or de-energized states of the solenoid valve, the electric field sensor means further being adapted for generating data corresponding with the state of the solenoid valve for analysis;

acoustic sensor means adapted for non-invasively detecting acoustic vibration produced by the solenoid valve as the plunger moves between its open and closed positions corresponding to changes in state of the solenoid valve, whereby the acoustic sensor means is adapted to detect acoustic vibration resulting from impacts associated with the plunger as movement of the plunger is between its open and closed positions, the acoustic sensor means further being adapted for generating data corresponding to the detected acoustic vibration for analysis; and processing means adapted for processing the data generated by the electric field sensor means and acoustic sensor means with time for monitoring the solenoid valve, said processing means further including voltage source identification means adapted for identifying the voltage source applied to the solenoid valve as either a direct current signal or an alternating current signal.

2. A non-invasive monitoring apparatus according to claim 1, wherein the electric field sensor means comprises a gauss probe.

3. A non-invasive monitoring apparatus according to claim 1, wherein the acoustic sensor means comprises an accelerometer.

4. A non-invasive monitoring apparatus according to claim 1, wherein the acoustic sensor means and electric field sensor means are positioned in contact with an exterior surface of the solenoid vane.

5. A non-invasive monitoring apparatus according to claim 4, wherein the acoustic sensor means and electric field sensor means are provided in combination as a single unit.

6. A non-invasive monitoring apparatus according to claim 4, wherein the acoustic sensor means and electric field sensor means are mounted on the exterior surface of the solenoid valve.

7. A non-invasive monitoring apparatus according to claim 1, further including counter means associated with the processing means adapted for timing a predetermined interval for monitoring the solenoid valve, said predetermined interval being initiated by a change in state of the solenoid valve from either the de-energized to the energized state or from the energized to the de-energized state.

8. A non-invasive monitoring apparatus according to claim 7, wherein the processing means includes valve state change detection means associated with and receiving the data generated by the electric field sensor means adapted for identifying a change in state of the solenoid valve between the energized and de-energized states, the valve state change detection means further being associated with the counter means, with the counter means being responsive to the valve state change detection means adapted for initiating the predetermined timed interval corresponding to a detected change in state of the solenoid valve.

9. A non-invasive monitoring apparatus according to claim 7, wherein the processing means further includes impact detection means associated with and receiving data generated by the acoustic sensor means adapted for identifying the impacts associated with the plunger as the movement of the plunger is between its open and closed positions, the impact detection means further being associated with the counter means, wherein the counter means is adapted to identify the time corresponding to the impacts of the plunger, the processing means further including error detection means for detecting impacts of the plunger occurring after termination of the predetermined timed interval indicative of a problem in the condition of operation of the solenoid valve.

10. A non-invasive monitoring apparatus according to claim 9, wherein the impact detection means is further adapted to identify a first impact and a last impact associated with the plunger over the predetermined interval.

11. A non-invasive monitoring apparatus according to claim 7, further including display means associated with the processing means adapted for displaying both the data corresponding to the impacts of the plunger and the state of the solenoid valve.

12. A non-invasive monitoring apparatus according to claim 1, wherein the processing means further comprises signal conditioning means adapted for conditioning the data generated by the acoustic sensor means and the electric field sensor means for analysis, the signal conditioning means comprising:

1) first and second amplification means adapted for receiving and amplifying a predetermined amount the data generated from the acoustic sensing means and electric field sensing means, respectively, wherein the generated data signals from the acoustic sensor means and electric field sensor means comprise analog voltage signals;

2) first and second filter means coupled to the first and second amplification means, respectively, adapted for filtering the analog signals to pass a predetermined range of frequencies;

3) first and second convertor means coupled to the first and second filter means, respectively, adapted for demodulating the analog signals; and 4) first and second amplification and offset means coupled to the first and second convertor means, respectively, adapted for both amplifying the signals a predetermined amount and resetting a position of the amplified signals a predetermined amount relative to a horizontal axis for analysis.

13. A non-invasive apparatus according to claim 12, wherein the conditioning means for conditioning the data generated from the acoustic sensing means further comprises signal delay means coupled to an output of the first convertor means and an input of the first amplification and offset means adapted for delaying the signal associated therewith a predetermined amount.

14. A non-invasive method adapted for monitoring a valve of the solenoid type having an electrical coil and a movable plunger disposed therein, the solenoid valve being operable between a de-energized state and an energized state in response to application of a suitable voltage source thereto, with the plunger movement being between an open position and a closed position corresponding to changes in the state of the solenoid valve and the electrical coil being adapted to generate an electric field when the solenoid valve is in its energized state, the non-invasive method comprising the steps of:

non-invasively monitoring the electrical coil for detecting the electric field generated thereby over a test cycle for identifying the state of the solenoid valve as either comprising the energized state or the de-energized state and generating data corresponding with the identified state of the solenoid valve for analysis;

non-invasively detecting acoustic vibration produced by the solenoid valve over the test cycle indicative of the movement of the plunger between its open and closed positions corresponding to changes in the state of the solenoid valve and generating data corresponding to the detected acoustic vibration for analysis; and processing the generated data corresponding to both the detected state of the solenoid valve and the detected acoustic vibration for monitoring the solenoid valve, wherein the step of processing the generated data further comprises the step of identifying the voltage source applied to the solenoid valve as either an alternating current signal or a direct current signal.

15. A non-invasive method according to claim 14, wherein the step of processing the generated data comprises the step of identifying generated data corresponding to the detected acoustic vibration representative of impacts associated with the plunger as the movement thereof is into its open or closed positions.

16. A non-invasive monitoring method according to claim 15, wherein the test cycle comprises a predetermined timed interval and the step of identifying the generated data corresponding to the detected acoustic vibration further includes the step of identifying the time corresponding to the impacts associated with the plunger over the test cycle, wherein said predetermined timed interval is initiated by a change in state of the solenoid valve from either the de-energized to the energized state or from the energized to the de-energized state, wherein the step of identifying the generated data corresponding to the detected acoustic vibration further includes the step of identifying impacts of the plunger occurring after termination of the predetermined timed interval indicative of a problem in the condition of operation of the solenoid valve.

17. A non-invasive monitoring method according to claim 16, wherein the step of identifying the generated data corresponding to the detected acoustic vibration further includes the step of identifying a rest impact and a last impact associated with the plunger over the test cycle and displaying the times associated therewith.

18. A non-invasive monitoring method according to claim 14, wherein the step of processing the generated data further comprises the step of identifying the change in the state of the solenoid valve as either from the energized state to the de-energized state or from the de-energized state to the energized state.

19. A non-invasive monitoring method according to claim 18, wherein the step of processing the generated data further includes the step of initiating the test cycle corresponding to the detection of the change in the state of the solenoid valve.

20. A non-invasive monitoring method according to claim 18, wherein the step of processing the generated data further includes the step of aborting the test cycle in response to more than one change in state of the solenoid valve detected during the test cycle.

21. A non-invasive monitoring method according to claim 15, wherein the step of processing the generated data further includes the step of aborting the test cycle in response to an impact of the plunger detected for a predetermined timed interval subsequent to termination of the test cycle.

22. A non-invasive method adapted for monitoring a valve of the solenoid type having an electrical coil and a movable plunger disposed therein, with the solenoid valve being operable between a de-energized state and an energized state in response to application of a suitable voltage source thereto, the plunger movement being between an open position and a closed position corresponding to changes in the state of the solenoid valve and the electrical coil being adapted to generate an electric field when the solenoid valve is in its energized state, the non-invasive method comprising the steps of:

providing an accelerometer and a gauss probe in contact with an exterior surface of the solenoid valve; and processing data generated by the accelerometer and gauss probe for monitoring the solenoid valve, wherein the step of processing data generated by the accelerometer and gauss probe further includes the steps of identifying data generated by the gauss probe representative of the change in the state of the solenoid valve and identifying data generated by the accelerometer coinciding with impacts associated with the plunger occurring as the plunger movement is between the open and closed positions, wherein the step of identifying data generated by the gauss probe and accelerometer, respectively, further includes the step of processing the data generated by the gauss probe and accelerometer over a predetermined test cycle and identifying the impacts of the plunger with time occurring over the test cycle, wherein said predetermined test cycle is initiated by a change in state of the solenoid valve from either the de-energized to the energized state or from the energized to the de-energized state; wherein the step of identifying data generated by the gauss probe and accelerometer further includes the step of identifying impacts of the plunger occurring after termination of the predetermined test cycle indicative of a problem in the condition of operation of the solenoid valve.

23. A non-invasive monitoring method according to claim 22 further including the step of:

displaying the data corresponding to both the changed state of the solenoid valve and impacts associated with the plunger for monitoring of the solenoid valve.

* * * * *